United States Patent
Liu et al.

(10) Patent No.: US 9,429,805 B2
(45) Date of Patent: Aug. 30, 2016

(54) ARRAY SUBSTRATE, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Chenxi Liu, Beijing (CN); Xibin Shao, Beijing (CN); Feng Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 55 days.

(21) Appl. No.: 14/418,226

(22) PCT Filed: May 12, 2014

(86) PCT No.: PCT/CN2014/077297
§ 371 (c)(1),
(2) Date: Jan. 29, 2015

(87) PCT Pub. No.: WO2015/100903
PCT Pub. Date: Jul. 9, 2015

(65) Prior Publication Data
US 2016/0026048 A1    Jan. 28, 2016

(30) Foreign Application Priority Data
Dec. 30, 2013   (CN) .......................... 2013 1 0745618

(51) Int. Cl.
*H01L 29/49* (2006.01)
*G02F 1/1362* (2006.01)
(Continued)

(52) U.S. Cl.
CPC ....... *G02F 1/136286* (2013.01); *G02F 1/1362* (2013.01); *G02F 1/1368* (2013.01);
(Continued)

(58) Field of Classification Search
CPC ............... G02F 1/136286; G02F 1/133707; G02F 1/134309; G02F 1/134363; G02F 1/1362; G02F 1/136209; G02F 1/136227; G02F 1/13624; G02F 27/124
See application file for complete search history.

(56) References Cited

U.S. PATENT DOCUMENTS 8,988,332 B2 *   3/2015   Lo ...................... G02F 1/134309
                                                                  345/87
9,190,558 B2 *  11/2015   Tsai .................... H01L 33/0041
(Continued)

FOREIGN PATENT DOCUMENTS

CN          101221332 A        7/2008
CN          101563646 A       10/2009
(Continued)

OTHER PUBLICATIONS

First Chinese Office Action issued Aug. 25, 2015: Appln. No. 201310745618.6.
(Continued)

*Primary Examiner* — Michael Shingleton
(74) *Attorney, Agent, or Firm* — Ladas & Parry LLP

(57) ABSTRACT

An array substrate, a display panel and a display device are provided. The array substrate comprises pixel units. The pixel unit comprises four sub-pixel electrodes and at least one thin film transistor for controlling the four sub-pixel electrodes. Domain alignments of the four sub-pixel electrodes within the pixel unit differ from each other, and domain alignments of the four sub-pixel electrodes within the pixel unit have a mirror-symmetrical distribution in up and down directions and in left and right directions.

19 Claims, 5 Drawing Sheets

(51) Int. Cl.
G02F 1/1337 (2006.01)
G02F 1/1343 (2006.01)
G02F 1/1368 (2006.01)
H01L 27/12 (2006.01)

(52) U.S. Cl.
CPC ..... *G02F1/13624* (2013.01); *G02F 1/133707* (2013.01); *G02F 1/134309* (2013.01); *G02F 1/134363* (2013.01); *G02F 1/136209* (2013.01); *G02F 1/136227* (2013.01); *H01L 27/124* (2013.01); *G02F 2001/134345* (2013.01)

(56) References Cited

U.S. PATENT DOCUMENTS

| | | | |
|---|---|---|---|
| 9,268,189 B2* | 2/2016 | Lee | G02F 1/136227 |
| 2008/0036931 A1 | 2/2008 | Chan et al. | |
| 2009/0322659 A1 | 12/2009 | Chan et al. | |
| 2010/0014012 A1 | 1/2010 | Irie et al. | |
| 2012/0206683 A1 | 8/2012 | Zhang | |
| 2014/0118652 A1* | 5/2014 | Zhang | G02F 1/134309 349/43 |
| 2014/0327852 A1* | 11/2014 | Chung | G02F 1/133707 349/43 |
| 2015/0168793 A1* | 6/2015 | Oh | G02F 1/133707 349/110 |
| 2015/0268527 A1* | 9/2015 | Kwon | G02F 1/136286 349/138 |
| 2015/0277192 A1* | 10/2015 | Park | G02F 1/134309 349/43 |
| 2016/0011477 A1* | 1/2016 | Lee | G02F 1/136286 349/42 |

FOREIGN PATENT DOCUMENTS

| | | |
|---|---|---|
| CN | 102062979 A | 5/2011 |
| CN | 103018984 A | 4/2013 |
| CN | 103185996 A | 7/2013 |
| EP | 0631172 A1 | 12/1994 |
| JP | 2004037851 A | 2/2004 |

OTHER PUBLICATIONS

Chinese Notice of Allowance issued Oct. 30, 2015; Appln. No. 201310745618.6.

Internaitonal Search Report Appln. No. PCT/CN2014/077297; Dated Sep. 15, 2014.

Written Opinion of the International Searching Authority Appln. No. PCT/CN2014/077297; Dated Sep. 18, 2014.

* cited by examiner

ARRAY SUBSTRATE, DISPLAY PANEL AND DISPLAY DEVICE

TECHNICAL FIELD

Embodiments of the disclosure relate to an array substrate, a display panel and a display device.

BACKGROUND

With the rapid development of liquid crystal display technology, people propose higher and higher requirements on display quality of the liquid crystal display. In order to achieve a wide viewing angle, the technologies using a pixel multi-domain design and a pixel mirror-symmetry design are widely adopted.

For display devices of modes such as ADS, IPS, VA and the like, an array substrate thereof is shown in FIG. 1. The array substrate comprises network units (pixel units 6P) formed by gate lines 1P and data lines 2P intersecting with each other, a sub-pixel electrode 3P in each of the network units has a dual-domain structure, and a thin film transistor 4P drives the network unit (pixel unit 6P) to which the thin film transistors belong, so as to achieve the wide viewing angle.

In the display device of ADS mode, a multi-dimensional electric field is formed with both an electric field generated at edges of slit electrodes in a same plane and an electric field generated between a slit electrode layer and a plate-like electrode layer, so that liquid crystal molecules at all orientations, which are provided directly above the electrodes or between the slit electrodes in a liquid crystal cell, can be rotated, In this way, the work efficiency of liquid crystal can be enhanced and the light transmittance can be increased. The ADS mode can improve the image quality of the thin film transistor liquid crystal display and has advantages of high transmittance, wide viewing angle, high aperture ratio, low chromatic aberration, high response speed, free of push Mura, etc. For different applications, improved ADS technologies comprise I-ADS with high transmittance, H-ADS with high aperture ratio and S-ADS with high resolution, etc.

However, the above-described array substrate cannot effectively solve the problem of color shift at some viewing angles.

SUMMARY

According to embodiments of the disclosure, there is provided an array substrate. The array substrate comprises pixel units. The pixel unit comprises four sub-pixel electrodes and at least one thin film transistor for controlling the four sub-pixel electrodes. Domain alignments of the four sub-pixel electrodes within the pixel unit differ from each other, and domain alignments of the four sub-pixel electrodes within the pixel unit have a mirror-symmetrical distribution in up and down directions and in left and right directions.

According to embodiments of the disclosure, there is provided a display panel. The display panel comprises the array substrate as described above and an opposed substrate bonded to the array substrate. The opposed substrate or the array substrate comprises a plurality of color filters of different colors, and the color filters cover the sub-pixel electrodes; the sub-pixel electrodes in one pixel unit of the array substrate correspond to the color filter of a same color, and the opposed substrate has a black matrix formed thereon, and the black matrix corresponds to gate lines, data lines and a boundary region between two adjacent sub-pixel electrodes.

According to embodiments of the disclosure, there is provided a display device. The display device comprises the display panel as described above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DESCRIPTION OF THE EMBODIMENTS

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1:
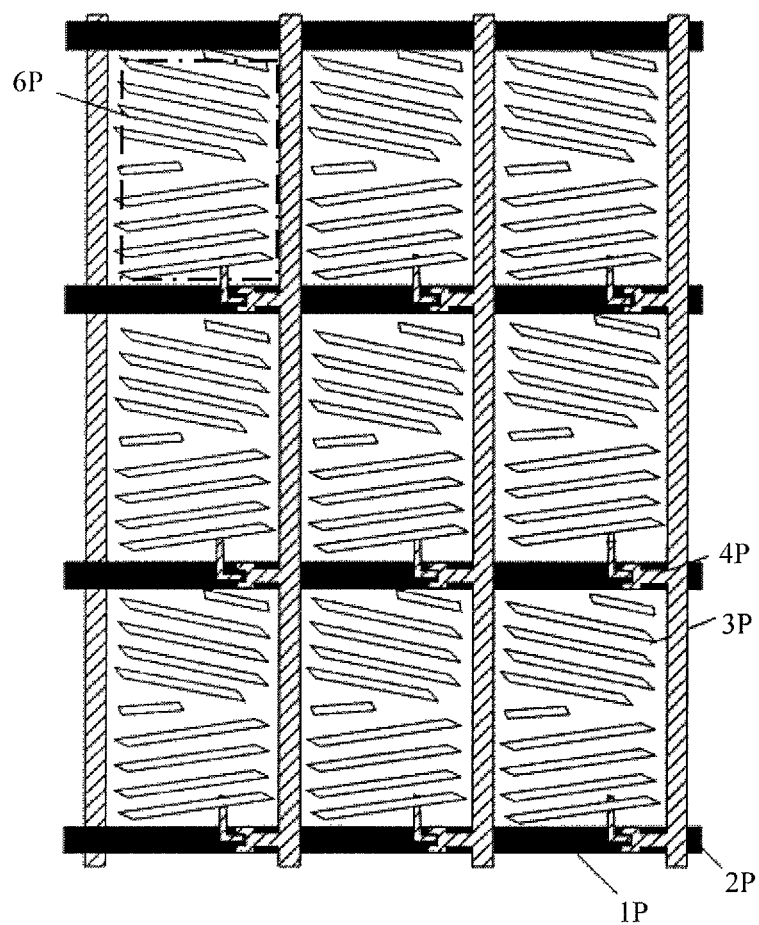
FIG. 1 is a structural schematic view illustrating an array substrate according to one technique.
Figure 2:
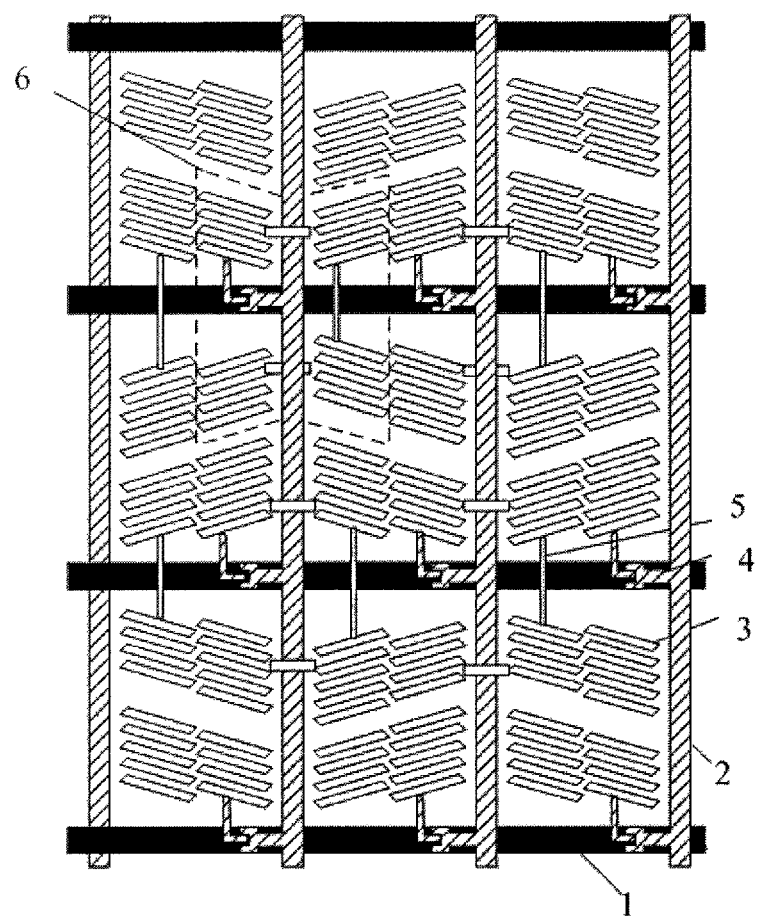
FIG. 2 is a structural schematic view illustrating an array substrate according to embodiments of the disclosure.

Embodiments of the disclosure provide an array substrate. As shown in FIG. 2, the array substrate comprises a plurality of gate lines 1, a plurality of data lines 2, and a plurality of network units formed by the gate lines 1 and the data lines 2 intersecting with each other. Each of the network units comprises: a thin film transistor 4 and four sub-pixel electrodes 3. These four sub-pixel electrodes have a same domain alignment but are disconnected from each other, and the thin film transistor 4 is connected to one of the four sub-pixel electrodes 3. The four sub-pixel electrodes within each network unit have the same domain alignment. In each row, the domain alignments of two adjacent network units are mirror-symmetrical with respect to the data line 2. In each column, the domain alignments of two adjacent network units are mirror-symmetrical with respect to the gate line 1.

With an intersection point of the gate line 1 and the data line 2 as a central point, four sub-pixel electrodes 3 adjacent to the central point and respectively coming from four different network units adjacent to the central point and a thin film transistor 4 for controlling the four sub-pixel electrodes 3 form a pixel unit (as shown by a dashed box in FIG. 2). Domain alignments of the four sub-pixel electrodes within the pixel unit differ from each other, and more specifically, domain alignments of the four sub-pixel electrodes within the pixel unit have a mirror-symmetrical distribution in all directions, such as up and down directions, left and right directions and the like.

For example, the thin film transistor is provided at the intersection point of the gate line 1 and the data line 2.

The gate line 1 provides a scanning signal to the thin film transistor, and the data line 2 provides a display signal to the sub-pixel electrodes 3 via the thin film transistor.

In each pixel unit, the network unit in a first quadrant is referred to as a first network unit, the network unit in a second quadrant is referred to as a second network unit, the network unit in a third quadrant is referred to as a third network unit, and the network unit in a fourth quadrant is referred to as a fourth network unit. In each network unit, the sub-pixel electrode in the first quadrant is referred to as a first sub-pixel electrode, the sub-pixel electrode in the second quadrant is referred to as a second sub-pixel electrode, the sub-pixel electrode in the third quadrant is referred to as a third sub-pixel electrode, and the sub-pixel electrode in the fourth quadrant is referred to as a fourth sub-pixel electrode.

As shown in FIG. 2, the domain alignments of the first to fourth sub-pixel electrodes within each network unit are the same.

With the intersection point of the gate line 1 and the data line 2 as the central point, the four sub-pixel electrodes adjacent to the central point form the pixel unit 6 which is indicated by the dashed box in FIG. 2. As shown in FIG. 2, the third sub-pixel electrode within the first network unit, the fourth sub-pixel electrode within the second network unit, the first sub-pixel electrode within the third network unit, and the second sub-pixel electrode within the fourth network unit form the pixel unit. For example, each pixel unit comprises one thin film transistor. As shown in FIG. 2, the thin film transistor within the pixel unit belongs to the first network unit, i.e., the thin film transistor drives the fourth sub-pixel electrode within the first network unit. The four sub-pixel electrodes within the pixel unit are connected by an electrode wire 5 made of a same material as that of the pixel electrodes, so that the thin film transistor drives the pixel unit.

For example, the sub-pixel electrodes 3 and the electrode wire 5 are made of a transparent conductive material such as ITO.

In FIG. 2, the thin film transistor within the pixel units belongs to the first network unit. However, the embodiments of the disclosure are not limited thereto, and the thin film transistor within the pixel unit may belong to the second network unit, the third network unit or the fourth network unit.

In the array substrate having the above-described structure according to the embodiments of the disclosure, the pixel unit presents the mirror-symmetrical distribution as viewed from any directions. A display screen comprises a display array constituted by the above-described pixel units has a high (optical) symmetry, and thus the problem of color shift can be effectively solved. Therefore, a wide viewing angle effect is more uniform and more stable, so that the display quality can be improved.

In a comparative example, in an array of a plurality of network units formed by gate lines and data lines, each network unit is just one pixel unit, and each pixel unit comprises the sub-pixel electrode and the thin film transistor for controlling the sub-pixel electrode. The sub-pixel electrode in the comparative example may be designed in either a single domain structure or a dual domain structure, and the dual domain design is mostly not mirror-symmetrical. Although theoretically, it is feasible to form a plurality of domains within the same pixel unit by etching; yet within the same network unit, the increase of the number of the domains will lead to decrease of effective display region and control region and decease of the aperture ratio, and thus the product competitiveness of the whole array substrate is reduced.

However, in the above-described array substrate according to the embodiments of the disclosure, the pixel electrodes of each network unit is designed in the single domain structure, but the pixel electrodes within each pixel unit have a plurality of domains and present the mirror-symmetrical distribution. Accordingly, the wide viewing angle can be achieved, and the problem of color shift at different directions, such as up and down directions, left and right direction and the like, can be effectively solved.

Figure 3:
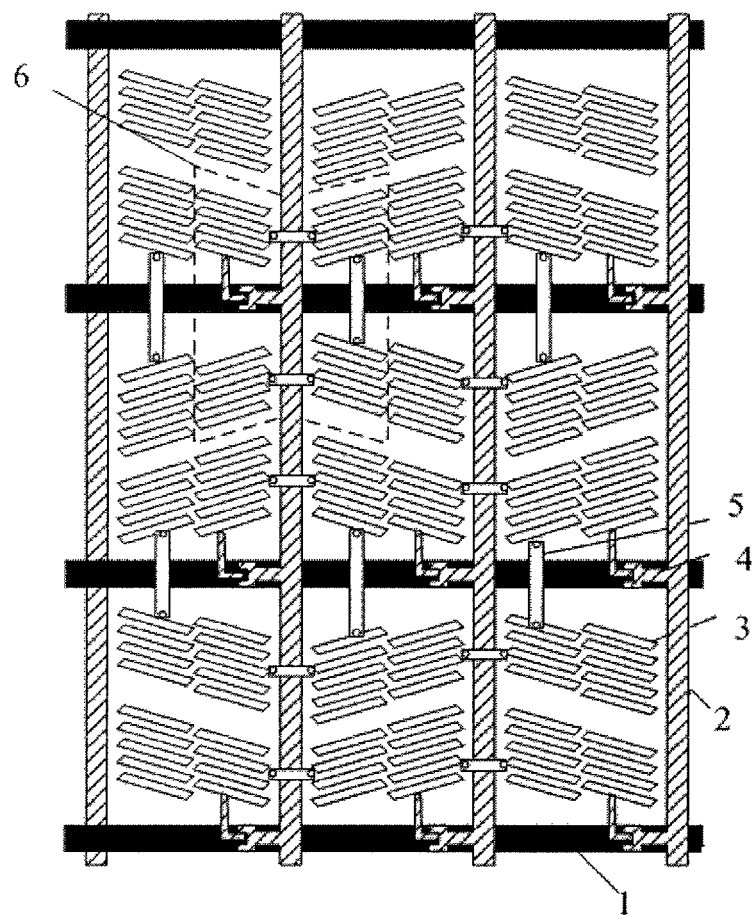
FIG. 3 is another structural schematic view illustrating the array substrate according to the embodiments of the disclosure.

FIG. 3 is another structural schematic view illustrating the array substrate according to the embodiments of the disclosure. The array substrate differs from the array substrate shown in FIG. 2 merely in that: the four sub-pixel electrodes 3 in the pixel unit 6 are connected with each other by the electrode wire 5 passing through a via hole. For example, the electrode wire 5 is made of a transparent conductive material such as ITO, or made of a conductive metal.

Figure 4:
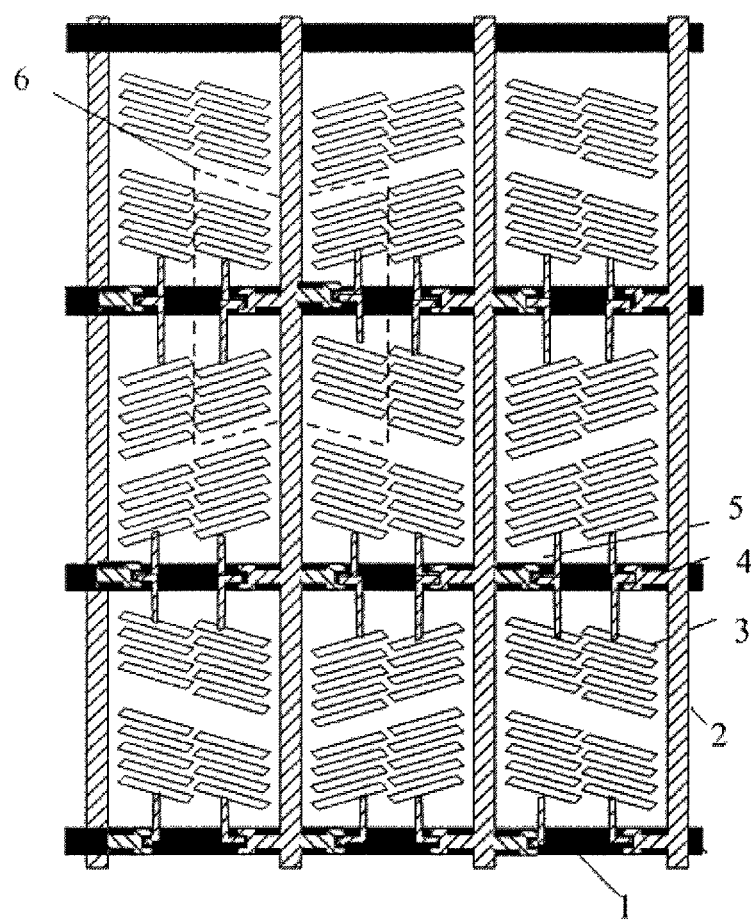
FIG. 4 is still another structural schematic view illustrating the array substrate according to the embodiments of the disclosure.

FIG. 4 is still another structural schematic view illustrating the array substrate according to the embodiments of the disclosure. The array substrate differs from the array substrate shown in FIG. 2 merely in that: the pixel unit 6 comprises two thin film transistors 4, and each thin film transistor 4 is respectively connected to two sub-pixel electrodes by the electrode wire 5.

Although the above embodiments describe that each pixel unit comprises one thin film transistor (as shown in FIG. 2) or two thin film transistors (as shown in FIG. 4); yet the embodiments of the disclosure are not limited thereto, and each pixel unit may comprise three or four thin film transistors.

When the number of the thin film transistor comprised in each pixel unit is 1, the thin film transistor is connected with one sub-pixel electrode within the pixel unit, and the one sub-pixel electrode is further connected with other sub-pixel electrodes within the pixel unit. For example, the one thin film transistor is connected with the sub-pixel electrode adjacent thereto.

When the number of the thin film transistors comprised in each pixel unit is 2, each thin film transistor is respectively connected with two sub-pixel electrodes. More specifically, one of the thin film transistors is connected with two sub-pixel electrodes within the pixel unit, the other of the thin film transistors is connected with remaining two sub-pixel electrode within the pixel unit, and the two sub-pixel electrodes are further connected with the remaining two sub-pixel electrodes. For example, each of the two thin film transistors is connected with two sub-pixel electrodes provided on upper and lower sides of the gate line.

When the number of the thin film transistors comprised in each pixel unit is 4, each thin film transistor is connected with one sub-pixel electrode.

Figure 5:
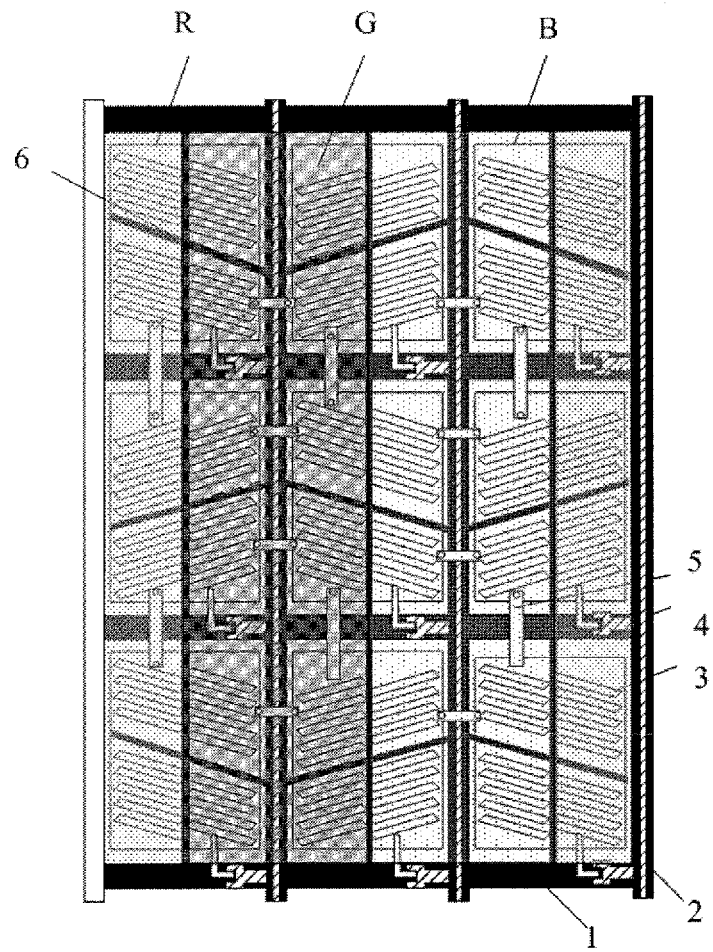
FIG. 5 is a structural schematic view illustrating a display panel according to the embodiment of the disclosure.

FIG. 5 is a structural schematic view illustrating a display panel according to the embodiments of the disclosure. For example, the display panel comprises the array substrate as shown in FIG. 2 and an opposed substrate bonded to the array substrate.

The opposed substrate comprises a plurality of color filters of different colors, and the color filters cover the sub-pixel electrodes 3.

The sub-pixel electrodes 3 in one pixel unit 6 of the array substrate correspond to the color filter of the same color, as shown in FIG. 5. For example, the sub-pixel electrodes 3 in one pixel unit correspond to a red (R) color filter. For example, the sub-pixel electrodes 3 in one pixel unit correspond to a green (G) color filter. For example, the sub-pixel electrode 3 in one pixel unit correspond to a blue (B) color filter. In the embodiments of the disclosure, an arrangement of the red, green and blue color filters comprises but is not limited to, the red, green and blue color filters being sequentially disposed in a horizontal direction and in a vertical direction.

The opposed substrate has a black matrix formed thereon, and the black matrix corresponds to the gate lines 1, the data lines 2 and a boundary region between two adjacent sub-pixel electrodes 3.

The above-described display panel may adopt the Color Filter on Array (COA) technology. That is, the color filters are formed on the array substrate.

In the display panel according to the embodiments of the disclosure, the problem of color shift is effectively solved, such that the wide viewing angle effect is more uniform and more stable, and the display quality is improved.

Embodiments of the disclosure further provide a display device. The display device comprises the display panel as described above. In addition, the display device may further comprise other components such as a backlight.

The foregoing embodiments merely are exemplary embodiments of the disclosure, and not intended to define the scope of the disclosure, and the scope of the disclosure is determined by the appended claims.

The present application claims priority of Chinese Patent Application No. 201310745618.6 filed on Dec. 30, 2013, and the above Chinese patent application is incorporated herein by reference in its entirety as part of the present application.

What is claimed is:

1. An array substrate, comprising pixel units, wherein
the pixel unit comprises four sub-pixel electrodes and at least one thin film transistor for controlling the four sub-pixel electrodes;
domain alignments of the four sub-pixel electrodes within the pixel unit differ from each other, and domain alignments of the four sub-pixel electrodes within the pixel unit have a mirror-symmetrical distribution in up and down directions and in left and right directions;
the array substrate further comprises: a plurality of gate lines, a plurality of data lines, and a plurality of network units formed by the gate lines and the data lines intersecting with each other;
each of the network units comprises the thin film transistor and four sub-pixel electrodes having a same domain alignment but disconnected from each other; and
with an intersection point of the gate line and the data line as a central point, four sub-pixel electrodes adjacent to the central point and respectively coming from four different network units adjacent to the central point and the thin film transistor for controlling the four sub-pixel electrodes form one pixel unit.

2. The array substrate according to claim 1, wherein
in each row, the domain alignments of two adjacent network units are mirror-symmetrical with respect to the data line; and
in each column, the domain alignments of two adjacent network units are mirror-symmetrical with respect to the gate line.

3. The array substrate according to claim 1, wherein the number of the thin film transistors comprised in the pixel unit is 1~4.

4. The array substrate according to claim 3, wherein when the number of the thin film transistor comprised in the pixel unit is one, the one thin film transistor is connected with one sub-pixel electrode within the pixel unit, and the one sub-pixel electrode is further connected with other sub-pixel electrodes within the pixel unit.

5. The array substrate according to claim 4, wherein the one thin film transistor is connected with the sub-pixel electrode adjacent thereto.

6. The array substrate according to claim 4, wherein the sub-pixel electrodes are connected with each other by an electrode wire.

7. The array substrate according to claim 6, wherein the electrode wire is made of a same material as that of the sub-pixel electrode.

8. The array substrate according to claim 6, wherein the electrode wire is a metal wire passing through a via hole.

9. The array substrate according to claim 3, wherein when the number of the thin film transistors comprised in each pixel unit is two, one of the thin film transistors is connected with two sub-pixel electrodes within the pixel unit, the other of the thin film transistors is connected with remaining two sub-pixel electrode within the pixel unit, and the two sub-pixel electrodes are further connected with the remaining two sub-pixel electrodes.

10. The array substrate according to claim 9, wherein each of the two thin film transistors is connected with two sub-pixel electrodes provided on upper and lower sides of the gate line.

11. The array substrate according to claim 3, wherein when the number of the thin film transistors comprised in each pixel unit is four, each thin film transistor is connected with one sub-pixel electrode.

12. A display panel, comprising the array substrate according to claim 1, and an opposed substrate bonded to the array substrate, wherein
the opposed substrate or the array substrate comprises a plurality of color filters of different colors, and the color filters cover the sub-pixel electrodes;
the sub-pixel electrodes in one pixel unit of the array substrate correspond to the color filter of a same color; and
the opposed substrate has a black matrix formed thereon, and the black matrix corresponds to gate lines, data lines and a boundary region between two adjacent sub-pixel electrodes.

13. A display device, comprising the display panel according to claim 12.

14. The display panel according to claim 12, wherein
the array substrate comprises: a plurality of gate lines, a plurality of data lines, and a plurality of network units formed by the gate lines and the data lines intersecting with each other;
each of the network units comprises the thin film transistor and four sub-pixel electrodes having a same domain alignment but disconnected from each other; and
with an intersection point of the gate line and the data line as a central point, four sub-pixel electrodes adjacent to the central point and respectively coming from four different network units adjacent to the central point and the thin film transistor for controlling the four sub-pixel electrodes form one pixel unit.

15. The display panel according to claim 14, wherein
in each row, the domain alignments of two adjacent network units are mirror-symmetrical with respect to the data line; and in each column, the domain alignments of two adjacent network units are mirror-symmetrical with respect to the gate line.

16. The display panel according to claim 14, wherein the number of the thin film transistors comprised in the pixel unit is 1~4.

17. The display panel according to claim 16, wherein when the number of the thin film transistor comprised in the pixel unit is one, the one thin film transistor is connected with one sub-pixel electrode within the pixel unit, and the one sub-pixel electrode is further connected with other sub-pixel electrodes within the pixel unit.

18. The display panel according to claim 16, wherein when the number of the thin film transistors comprised in each pixel unit is two, one of the thin film transistors is connected with two sub-pixel electrodes within the pixel unit, the other of the thin film transistors is connected with remaining two sub-pixel electrode within the pixel unit, and the two sub-pixel electrodes are further connected with the remaining two sub-pixel electrodes.

19. The display panel according to claim 16, wherein when the number of the thin film transistors comprised in each pixel unit is four, each thin film transistor is connected with one sub-pixel electrode.

* * * * *